United States Patent [19]

Knight et al.

[11] 4,402,089
[45] Aug. 30, 1983

[54] TELEVISION TUNING SYSTEM WITH ELECTRONIC FREQUENCY ADJUSTMENT APPARATUS

[75] Inventors: Stanley P. Knight, Cranbury; John G. N. Henderson, Princeton, both of N.J.

[73] Assignee: RCA Corporation, New York, N.Y.

[21] Appl. No.: 302,853

[22] Filed: Sep. 16, 1981

[51] Int. Cl.³ .............................................. H04B 1/26
[52] U.S. Cl. .................................. 455/186; 455/191; 455/192; 455/197; 455/195; 455/340
[58] Field of Search ........ 455/180, 182, 186, 188–192, 455/195–197, 226, 340; 358/191.1, 195.1; 334/15

[56] References Cited

U.S. PATENT DOCUMENTS

| | | | |
|---|---|---|---|
| 2,978,655 | 4/1961 | Fernsler | 455/226 |
| 3,473,128 | 10/1969 | Kiser | 455/192 |
| 3,505,620 | 4/1970 | Mingr | 455/195 |
| 3,643,168 | 2/1972 | Manicki | 455/195 |
| 3,652,960 | 3/1972 | Sakamoto et al. | 334/15 |
| 3,778,736 | 12/1973 | Sakamoto | 334/15 |
| 3,810,022 | 5/1974 | Collins | 325/459 |
| 3,999,131 | 12/1976 | Fukuda et al. | 455/186 |
| 4,047,112 | 9/1977 | Sakamoto | 325/455 |
| 4,081,771 | 3/1978 | Hendrickson | 334/15 |
| 4,156,850 | 5/1979 | Beyers, Jr. | 325/455 |
| 4,158,816 | 6/1979 | Wine | 325/464 |
| 4,164,711 | 8/1979 | Steckler et al. | 325/464 |
| 4,209,751 | 6/1980 | Sakamoto | 455/186 |
| 4,271,529 | 6/1981 | Strammello | 455/188 |
| 4,318,130 | 3/1982 | Heuer | 455/186 |
| 4,334,323 | 6/1982 | Moore | 455/179 |
| 4,352,206 | 9/1982 | Aschwanden | 455/186 |
| 4,361,909 | 11/1982 | Theriault | 455/286 |
| 4,368,541 | 1/1983 | Evans | 455/186 |
| 4,369,417 | 1/1983 | Kupfer | 334/15 |

OTHER PUBLICATIONS

Fischer, T., "Digital VLSI Breeds Next-Generation TV Receivers", *Electronics*, Aug. 11, 1981, pp. 97–103.
Caironi, G. "EPM: A New Tuning System Based on a Single Chip Including Non-Volatile Memory", *IEEE Transactions on Consumer Electronics*, vol. CE-25, Aug. 1979, pp. 606–620.
Penner, L. et al., "An Electronic Tuning System for TV Receivers Utilizing a Nonvolatile MNOS Memory", 1976 *IEEE International Solid-State Circuits Conference*, pp. 70–71.
Penner, L., "Digital Television Tuner Uses MOS LSI and Nonvolatile Memory", *Electronics*, Apr. 1, 1976, pp. 86–90.
*A New Dimension-VLSI Digital TV System*, ITT Intermetall, Freiburg, Sep. 1981, pp. 1–21.
M. E. Frerking, *Crystal Oscillator Design and Temperature Compensation*, Van Nostrand Reinhold Co., 1978, pp. 142–143.
H. Taud et al., *Digital Integrated Circuits*, McGraw-Hill Book Co., 1977, pp. 442–443.

*Primary Examiner*—Jin F. Ng
*Attorney, Agent, or Firm*—E. M. Whitacre; P. J. Rasmussen; C. A. Berard

[57] ABSTRACT

A television (TV) receiver tuning system for selecting one of a plurality of receivable TV channels comprises a frequency selective radio frequency device including trimming elements for receiving TV signals, a local oscillator controlled by a first control signal and a mixer in which the TV signals and the local oscillator signal are heterodyned to develop an intermediate frequency signal. A first control device develops the first control signal in response to the selection of a TV channel to control the local oscillator frequency so that the mixer shifts the selected TV channel signal to the IF frequency. A second control device including a PROM trims the frequency selectivity of the RF device using its trimming elements unaffected by selection of the TV channel whereby mechanical alignment of the TV tuning system can be avoided. In other aspects of the invention, the second control device develops signals for adjusting tunable circuits in the IF amplifier, for adjusting the tracking of the local oscillator frequency in relation to its control signal, and, in a double-conversion tuner, for adjusting the frequency of a second local oscillator.

25 Claims, 8 Drawing Figures

TELEVISION TUNING SYSTEM WITH ELECTRONIC FREQUENCY ADJUSTMENT APPARATUS

The present invention relates generally to television tuning systems and, in particular, to those employing apparatus for electronically adjusting and trimming frequency selective portions thereof.

In many television (TV) receivers, the frequency of the local oscillator signal is controlled by a tuning voltage such that the radio frequency (RF) signal corresponding to a selected channel is shifted in a mixer to a predetermined intermediate frequency (IF). That tuning voltage is developed in response to the selection of a channel by a viewer, either by (1) a voltage synthesizer which can include a device for proportioning a reference voltage into a plurality of tuning voltages corresponding to selectable channels, or (2) by a frequency synthesizer which can include a crystal oscillator for developing a reference frequency to which the local oscillator signal frequency, divided by a predetermined number related to the channel selected, is regulated by a phase-locked loop. In addition, an automatic fine tuning (AFT) feedback loop may be employed to more precisely adjust the frequency of the local oscillator signal.

Tuning controls of the sort just described commonly develop bandswitching signals for controlling various filters and signal-path switches relating to the received TV bands, e.g., low-VHF, high-VHF and UHF TV bands. In addition, the tuning voltage for the local oscillator can be employed to coarsely adjust the frequency selectivity of certain filter circuits, such as a low-VHF, high-VHF or UHF-band filter.

Owing to the normal tolerances of components employed in such tuning systems and to normal production variations, it is necessary that a number of tunable circuits in the band filters, local oscillators and IF amplifiers be initially adjusted to exhibit predetermined frequency selective characteristics so that the electronic tuning system described above can operate satisfactorily. This initial adjustment or factory alignment is directed to trimming the frequency responses of various tuned circuits to the particular response necessary for the tuning system to respond satisfactorily to channel selection by a viewer at a later time. Those adjustments, conventionally made by mechanically adjusting the values of inductances and/or capacitances in tuned circuits, are difficult and time-consuming to make, often requiring an iterative alignment procedure. As a practical matter, certain functions, such as obtaining a specific local oscillator frequency versus tuning voltage response or tracking the center frequency of a tunable filter with the selected channel frequency, cannot be aligned for optimum performance over the entire TV frequency band so that a compromise performance must be accepted. As a result, the cost of a TV receiver is substantially increased due to the considerable production labor involved in the alignment process, and its performance is reduced.

It would be desirable, therefore, to construct a tuning system in which the need for conventional mechanical alignment could be eliminated. The tuning system of the present invention makes that objective possible and also provides the further advantage of permitting the alignment to be further adjusted for optimum performance over the entire TV frequency band. Moreover, re-alignment, if necessary, can be easily performed in the field without returning the tuning system to the factory or a service center.

Tuned circuits include reactive elements so as to exhibit a frequency selective response characteristic with respect to a given frequency or a given band of frequencies. As used herein, trimming indicates adjustment of elements within those circuits to vary their frequency response with respect to substantially the same given frequency or band of frequencies. Ordinarily, the amount of adjustment necessary to trim a circuit to be within an acceptable variance from a predetermined frequency response characteristic is small and results from small tolerances in the value of elements employed in the tuned circuits. The foregoing applies equally to high-pass, low-pass and band-pass filters, to band rejection filters (e.g., trap circuits), to resonant circuits as for tuning oscillators, and the like.

In the present invention, a tuning system for a receiver for selecting a presently selected one radio frequency (RF) signal of a plurality of receivable RF signals comprises an RF device having first elements for providing frequency selectivity and second elements for trimming the frequency selectivity, an oscillator for developing an oscillator signal at a frequency controlled by a first control signal, and a mixer for heterodyning the RF signals and the oscillator signal to develop an intermediate frequency (IF) signal at a predetermined frequency. A first control device develops the first control signal in response to selection of the selected one RF signal so that the one RF signal is shifted to the predetermined IF frequency by the mixer. A second control device develops a trimming signal unaffected by selection of the one RF signal and applies the trimming signal to the second elements to trim the frequency selectivity.

In another of its aspects, the present invention includes a plurality of tunable circuits within the RF device for adjusting its frequency selectivity responsive to a plurality of adjustment signals. The adjustment signals are stored in a memory and are applied to respective ones of the tunable circuits for adjusting the frequency selectivity.

Figure 1:
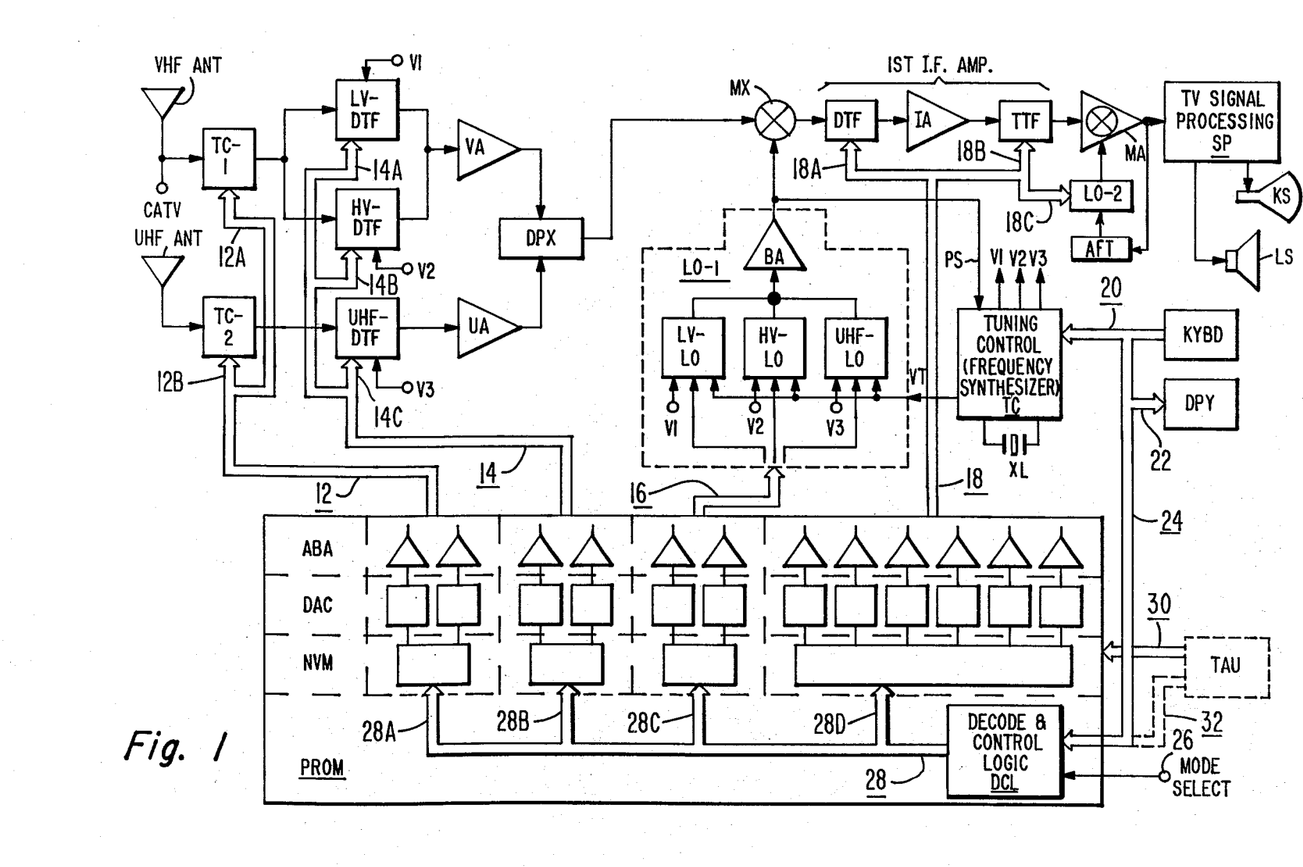
FIG. 1 is a block diagram of a television receiver including the present invention.

In the TV receiver of FIG. 1, VHF broadcast TV signals are received by antenna VHF-ANT, cable TV signals by terminal CATV, and by the following frequency selective RF circuits. Trap circuit TC-1 is a filter fixed-tuned to attenuate the second IF frequency, i.e., about 46 megahertz (MHz). When the selected channel is in the low-VHF or midband CATV band (54–150 MHz), bandswitching voltage V1 enables the double-tuned filter LV-DTF to pass RF signals from TC-1 to VHF amplifier VA. When the selected channel is in the upper portion of the midband CATV, high-VHF, or superband CATV band (150–402 MHz), bandswitch voltage V2 is present, enabling double-tuned band filter HV-DTF to pass RF signals from TC-1 to VA. RF signals from VA are coupled to mixer MX by RF diplexer DPX.

RF signals in the UHF-band (470–890 MHz) are received by antenna UHF-ANT and the following frequency selective RF circuits. Trap circuit TC-2 is a filter fix-tuned to attenuate RF signals at the first IF frequency, i.e., about 416 MHz. When the selected channel is the UHF-band, bandswitching voltage V3 is present enabling double-tuned band filter UHF-DTF to pass RF signals from TC-2 to UHF amplifier UA. RF signals from UA are coupleed to mixer MX by diplexer DPX.

First local oscillator LO-1 develops an oscillator signal at a frequency related to that of the selected channel signal such that the IF signal produced by mixer MX, as a result of heterodyning the RF signal from DPX and the local oscillator signal, is at a predetermined IF frequency, e.g., about 416 MHz. That IF signal is amplified and coupled to a second mixer MA by the first IF AMP. IF AMP includes a double-tuned input filter DTF for restricting the bandwidth of the IF signal to be applied to intermediate amplifier IA. Amplified IF signal from IA is passed by triple-tuned bandpass output filter TTF to mixer MA. Where a television channel has a bandwidth of about 6 MHz, as is the case in the United States, it is satisfactory that DTF have a pass band of about 12 MHz width and that TTF have a pass band of about 10 MHz width. The combination DTF, IA and TTF form a bandpass amplifier which restricts the frequencies of signals passed with substantial amplification from first mixer MX to second mixer MA.

Second mixer-amplifier MA heterodynes IF signals from IF AMP and local oscillator signals from second local oscillator LO-2 to develop and apply a second IF frequency signal to TV signal processing circuitry SP. The frequency of the LO-2 signal is, for example, 370 MHz, so that the 416 MHz IF signal is shifted to the conventional TV IF signal frequency, e.g., about 46 MHz. An automatic fine tuning control AFT loop can be employed to more precisely regulate the second IF frequency.

TV signal processing circuit SP is conventional and applies the demodulated video portion of the TV signal to kinescope KS for displaying a TV picture and applies the demodulated audio portion thereof to loudspeaker LS for reproducing the sound program.

Channel selection and determination of first local oscillator LO-1 signal frequency are accomplished as follows. Tuning control TC receives indication of the channel selected from a user input device, for example, keyboard KYBD, via signal bus 20. (Broad arrows are used in FIG. 1 to indicate that a plurality of signals are transmitted from one block to another; it may indicate digital signals, analog signals, or a combination thereof.) Signal bus 20, for example, is preferably a 2-wire digital data bus for serially transmitting a binary-coded decimal (BCD) two-digit word from KYBD to TC. Encoded selected channel information is further coupled to display DPY via bus 22 for providing the user with a digital indication of the channel selected. In response to selection of a channel, TC develops tuning control voltage VT and bandswitching voltages V1, V2, and V3 depending upon whether the selected channel is in the low-VHF, high-VHF or UHF TV frequency bands, respectively.

First local oscillator LO-1 includes three voltage controlled oscillators LV-LO, HV-LO, and UHF-LO corresponding respectively to the low-VHF, high-VHF and UHF frequency bands. The particular oscillator associated with the frequency band which contains the selected channel is enabled by bandswitch voltage V1, V2 or V3, and its oscillation frequency is controlled between a low value and a high value by tuning voltage VT. The oscillator signal from the enabled oscillator is amplified and coupled to mixer MX by buffer amplifier BA.

The LO-1 oscillator signal at the output connection of BA is fed back to TC at its prescaler input point PS for providing degenerative feedback to control tuning voltage VT developed by the frequency synthesizer included within TC of the present tuning system. The prescaler is a frequency divider which divides the LO-1 signal frequency by a number N, the value of which is determined in response to the channel selected indication. The LO-1 frequency divided by N is compared with a reference frequency developed by an oscillator controlled by crystal XL. Tuning control voltage VT is developed from the error signal generated by that phase comparison and is applied to LO-1 to control its frequency thereby completing a frequency synthesizer, phase-locked loop tuning system.

Particular details of the double-conversion and the frequency synthesizer tuning systems thus far described, although not necessary for understanding the present invention, can be found in U.S. patent application Ser. No. 294,133 entitled, TUNING SYSTEM FOR A TELEVISION RECEIVER, filed by G. E. Theriault on Aug. 19, 1981, and U.S. Pat. No. 4,031,549, entitled, TELEVISION TUNING SYSTEM WITH PROVISIONS FOR RECEIVING RF CARRIER AT NON-STANDARD FREQUENCY, issued in the names of R. M. Rast et al. on June 21, 1977, both of which are assigned to the same assignee as is the present invention and are incorporated herein by reference.

Tunable circuits in traps TC-1 and TC-2, in RF band filters LV-DTF, HV-DTF and UHF-DTF, in IF filter circuits DTF and TTF, and in oscillators LV-LO, HV-LO, UHF-LO and LO-2 must all be aligned and adjusted to obtain prescribed frequency selective characteristics so that the tuning system operates satisfactorily as described above. To that end, electronic adjustment apparatus includes programmable read-only memory PROM which is employed as a control device for storing, developing and applying appropriate adjustment and control signals for trimming the aforementioned tunable circuits.

PROM comprises a nonvolatile memory NVM, the sections of which are shown in FIG. 1 by the rectangles to the right of reference designation NVM. Coded signals representing values of the various adjustment and control signals in the form of binary digital words are stored in memory locations within NVM. Decode and control logic DCL responds to coded selected channel information received from KYBD via signal bus 24, preferably as a two-digit BCD digital word, to address the appropriate memory locations in NVM via control bus 28. Digital-to-analog converters DAC (ones of which are shown by the squares to the right of reference designation DAC) receive respective coded signals stored in addressed locations of NVM and develop therefrom respective analog adjustment and control signals. Those analog signals, typically spanning a 0–5 volt range are amplified to span a 0–30 volt range and are applied to the various tunable circuits by analog buffer amplifiers ABA (ones of which are shown by the triangles to the right of reference designation ABA). PROM is partitioned into sections, indicated by the dashed vertical lines therein, corresponding to the different portions of the receiver for which adjustment and control signals are to be developed. While commercially available programmable read-only memories of either the electrically erasable (EEPROM) or ultra-violet-light erasable (UVPROM) types, such as types 2816 and 2716, respectively, available from Intel, Inc., which include only the NVM and the control logic therefor, are satisfactory, it is preferred that an integrated circuit including at least DCL, NVM and DAC, and preferably ABA, be employed.

The preferred arrangements of the electronic adjustment apparatus for adjusting the tunable circuits in the tuning system of FIG. 1 are as follows. Trap circuits TC-1 and TC-2 are each preferably double-tuned circuits. Thus, two adjustment signals, coupled by two wires in signal buses 12A and 12B, respectively, are required to trim each. Because a VHF and a UHF channel can never be selected simultaneously, TC-1 and TC-2 need never be operative simultaneously so that 12A and 12B can be connected in parallel in two-wire signal bus 12. As a result, although PROM provides four locations storing 8-bit digital words in memory NVM for trap adjustment coded signals, only two DACs and two ABAs are required. The appropriate two of the four memory locations in NVM are addressed via control bus 28A by DCL responsive to the reception band which includes the selected channel.

Band filters LV-DTF, HV-DTF and UHF-DTF are each double-tuned filters employing two tunable circuits. Since they need never be operative simultaneously, signal buses 14A, 14B and 14C, each including two wires, are connected in parallel to conduct control signals from signal bus 14. Similarly to the trap circuit controls, only two DACs and ABAs are required. The minimum number of memory locations required to store 8-bit control signal values for the band filters is six, i.e., two values for each of the three filters.

It is preferred, however, that each band filter be a bandpass network having a bandwidth of about two to five times the 6 MHz bandwidth of a TV channel and centered in relation to a center frequency which is variable. The control signals developed by PROM are programmed so that the center frequency of the appropriate band filter is substantially the carrier frequency of the RF signal corresponding to the selected channel. To receive 127 channels in the VHF, UHF and CATV bands, 254 memory locations for 8-bit digital words are required in NVM, i.e., 127 values for each of two control signals. The appropriate two memory locations are addressed via control bus 28B by DCL responsive to selection of a channel. In addition, because an optimized control signal value can be stored for each of the receivable channels, the band filters can be optimally tuned for each channel, thereby avoiding the performance comprise necessary in previous tuning systems not including the present invention. Moreover, the need for matching elements employed in the tunable circuits, such as capacitance diodes, as well as the need for tracking the tuning characteristics of a plurality of filters against a common control signal, can be eliminated.

Because the bandwidth of the RF band filters can be relatively broad without significantly impairing the quality of TV reception, 8-bit resolution is satisfactory for NVM and DAC. This is much lower, and therefore less expensive to implement, than the memory for controlling local oscillator frequency for channel selection, for example, which requires 12 to 14 bits of resolution. As a result, it is not necessary to make the RF filters track offsets in the frequency of LO-1 or LO-2 generated by an AFT control loop to accommodate channels transmitted with carrier frequencies offset from the FCC-established standard broadcast frequencies, as is often the case for CATV distribution systems.

Each of local oscillators LV-LO, HV-LO and UHF-LO is aligned so that a prescribed relationship obtains between the oscillator signal frequency and the tuning voltage VT. Each LO includes at least two tunable trimming circuits for adjusting its minimum and maximum frequency of oscillation responsive to the minimum and maximum values of VT to correspond to the frequency range of the particular reception band which it serves. This adjustment assures that the frequency synthesizer phase-locked loop will have sufficient dynamic range to correctly tune all channels in that reception band. The two adjustment signals therefor can have two values so that 12 memory locations for 8-bit digital words are required in NVM, i.e., two circuits times two values times three oscillators. The appropriate two locations in NVM corresponding to the band which includes the selected channel are addressed via control bus 28C by DCL. Signal bus 16 requires only two wires for the same reasons as did signal buses 12 and 14; only two DACs and ABAs are required.

In first IF-AMP, filter DTF includes two tunable circuits and filter TTF includes three tunable circuits so that a total of five trim adjustment signals must be applied via signal buses 18A and 18B. Oscillator LO-2 includes a single tunable circuit and requires a single trim adjustment signal from bus 18C. Because these blocks are operative simultaneously, a total of six adjustment signals are coupled by six wires in signal bus 18. Accordingly, six memory locations for 8-bit digital words in NVM, six DACs and six ABAs are provided. Because these six trim adjustments are unaffected by the channel selected, DCL does not address these six memory locations responsive to channel selection.

Having thus described the operation of the electronic adjustment apparatus including the present invention, an alignment and trimming procedure by which the coded signals are programmed into the memory locations of NVM in the PROM will now be described.

Memory NVM of electrically erasable programmable read only memory PROM in FIG. 1 is conditioned for programming by a mode select signal comprising a digital "high" signal applied at terminal 26 which is otherwise held at a "low" signal (e.g., ground). Memory address signals are supplied from TAU but applied to DCL via data bus 32. Eight-bit digital words applied to the output leads of addressed memory locations from tuner adjustment unit TAU (shown in phantom since it is connected only to effect adjustments) via digital data bus 30 are stored in the addressed memory locations and are converted into respective adjustment and control signals by digital-to-analog converters DAC.

Adjustment is effected by TAU developing an address signal on data bus 32, and then varying the digital words on data bus 30 until the desired operating condition is achieved as measured at appropriate places in the tuning system with appropriate test signals (not shown) applied thereto. For example, local oscillator LO-2 can be adjusted by addressing (via control bus 28D) the memory location in which the word corresponding to the value of its trim adjustment signal is stored and then monitoring the LO-2 frequency while that value is changed by TAU. When a frequency acceptably close to 370 MHz is produced, the digital word producing that frequency is stored in NVM by a "low" signal at terminal 26.

By way of further example, first IF AMP can be aligned by injecting picture and sound carrier signals at its input from MX and then monitoring the respective magnitudes of those carriers at the input to IA while the digital words for DTF are varied until satisfactory respective magnitudes result. Then, after those trim adjustment signal values for DTF are stored, a similar procedure for TTF is performed. Similarly, trap circuits TC-1 and TC-2 can be trimmed by applying a signal at the frequency to be trapped and then varying the value of their adjustment signals until maximum signal attenuation is achieved.

Alternatively, a broadband signal spectrum could be applied to a filter under adjustment and its resulting output signal spectrum could be monitored. Although exemplary adjustments have been described, the remaining adjustments will be apparent to those skilled in the art of television tuners. A satisfactory sequence of adjustment is as follows:

1. LO-2;
2. LO-1 (including LV-LO, HV-LO and UHF-LO);
3. DTF in first IF AMP;
4. TTF in first IF AMP;
5. TC-1 and TC-2;
6. LV-DTF;
7. HV-DTF; and
8. UHF-DTF.

It is noted that other sequences can also be satisfactorily employed.

Figures 2A, 3A:
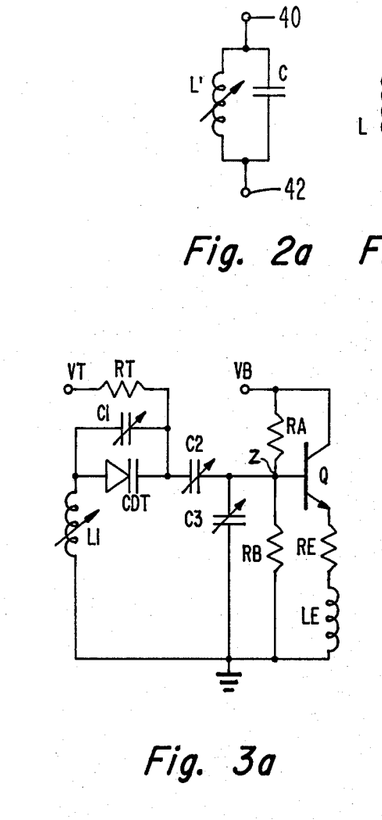
FIGS. 2, 3 and 4 are schematic diagrams of circuits useful with respect to the present invention.
Figures 2B, 2C, 3B:
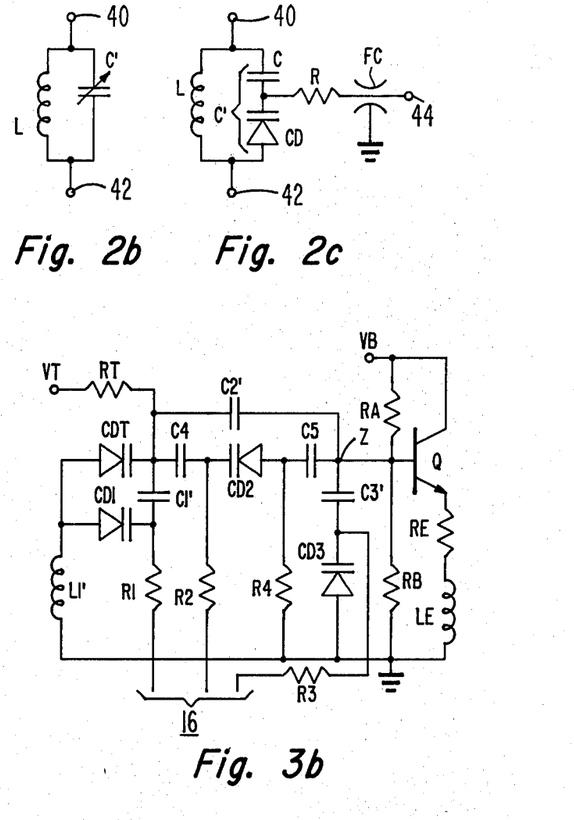

Exemplary parallel tunable circuits of the sort employed in the tuning system of FIG. 1 are shown in FIG. 2. FIGS. 2(a) and 2(b) show fixed capacitance C connected in parallel with mechanically variable inductance L' and mechanically variable capacitance C' connected in parallel with fixed inductance L between terminals 40 and 42, thereby forming parallel-resonant circuits. The electronically tuned circuit of FIG. 2(c), which avoids mechanically adjustable elements L' and C', can be substituted for either of the circuits of FIGS. 2(a) and 2(b). Variable capacitance C' is developed across the series combination of fixed capacitance C and variable capacitance diode CD. The capacitance of CD varies inversely responsive to reverse-bias voltage applied from terminal 44 through relatively high valued resistance R. A low impedance bypass for high frequency signals at terminal 44 is provided by filter capacitance FC. It is understood that a similar substitution can be made in a series-resonant trimming circuit.

An exemplary local oscillator circuit is shown in FIG. 3(a). NPN transistor Q is connected between bandswitch voltage VB and ground and is biased into its active region by voltage divider resistors RA and RB connected to its base. Its emitter network, including resistance RE and inductance LE, provides a reactance which, when reflected into the base circuit of Q, results in a negative impedance being exhibited between circuit point Z and ground. A tuned circuit including mechanically variable inductance L1, mechanically variable capacitances C1, C2, C3 and voltage-variable capacitance diode CDT is connected between point Z and ground. The combination oscillates at about the resonant frequency of the tuned circuit which is varied by tuning voltage VT applied through relatively high valued resistance RT to vary the capacitance of diode CDT. So that RF signals to be received in a band can be heterodyned to the selected IF frequency, the oscillation frequency of LO-1 must follow a prescribed relationship with respect to the range of values of VT. To that end, adjustable elements L1, C1, C2 and C3 are provided for adjusting the resonant frequency of the tuned circuit both absolutely and relative to the capacitance exhibited by CDT.

The oscillator of FIG. 3(a) is modified in FIG. 3(b) by the inclusion of electronically tunable trim circuits as described above in relation to FIG. 2(c). Capacitance C1', capacitance diode CD1 and resistance R1 are substituted for capacitor C1; capacitance C3', capacitance diode CD3 and resistance R3 are substituted for capacitance C3. Although it is contemplated that it is satisfactory to employ only fixed capacitance C2', it is shown by way of example that capacitances C4, C5, capacitance diode CD2 and resistances R2, R4 could be substituted for variable capacitance C2. Adjustment signals are applied to CD1, CD2 and CD3 from signal bus 16 by way of resistances R1, R2 and R3, respectively. Because each tunable circuit is independently adjustable, there is no need for matching the capacitance diodes employed therein, and there is no need for tracking the oscillator and band filter responses to the same tuning voltage VT.

Figure 4:
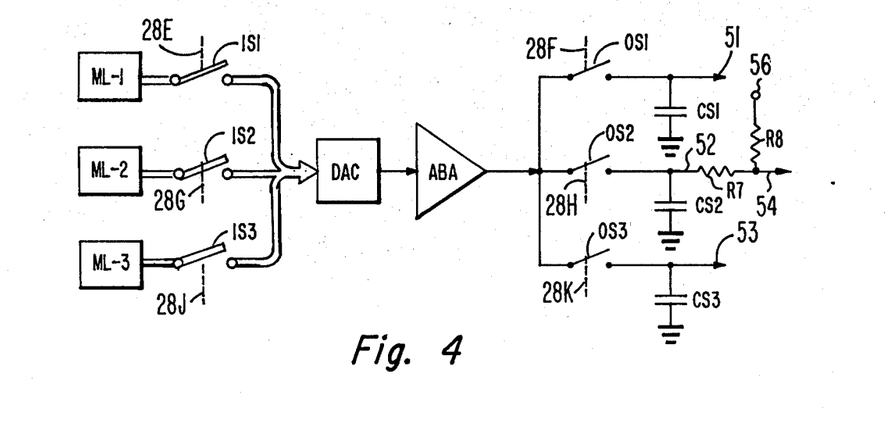

FIG. 4 shows a modification to PROM in which a single digital-to-analog converter DAC and amplifier ABA develop adjustment signals for a plurality of adjustable circuits in the tuning system of FIG. 1. Coded signals representing values of, for example, three adjustment signals are stored in memory locations ML-1, ML-2 and ML-3 within NVM. These coded signals are applied in turn to the input point of DAC by their respective input switches IS1, IS2 and IS3 in response to control signals supplied from DCL via lines 28E, 28G and 28J, respectively, of control bus 28. In fact, switches IS1, IS2 and IS3 are multiplexers and the broad arrows are digital data buses for applying a plurality of binary signals to DAC. After a predetermined time interval following closure of IS1, for example, to allow the first adjustment signal from DAC and ABA to settle, output switch OS1 is closed by a control signal supplied from DCL via control bus 28F. Closure of OS1 charges storage capacitance CS1 to the voltage of the adjustment signal which is applied to its corresponding tunable circuit via lead 51. OS1 and IS1 are then opened, after which IS2 and then OS2 are closed to develop a second adjustment signal on lead 52 and stored in storage capacitance CS2. Thereafter, OS2 and IS2 are opened and the conversion-storage sequence is performed for the third adjustment signal on capacitance CS3 and lead 53. The sequence is repeated periodically to maintain CS1, CS2 and CS3 at their respective adjustment voltage levels.

Figure 5:
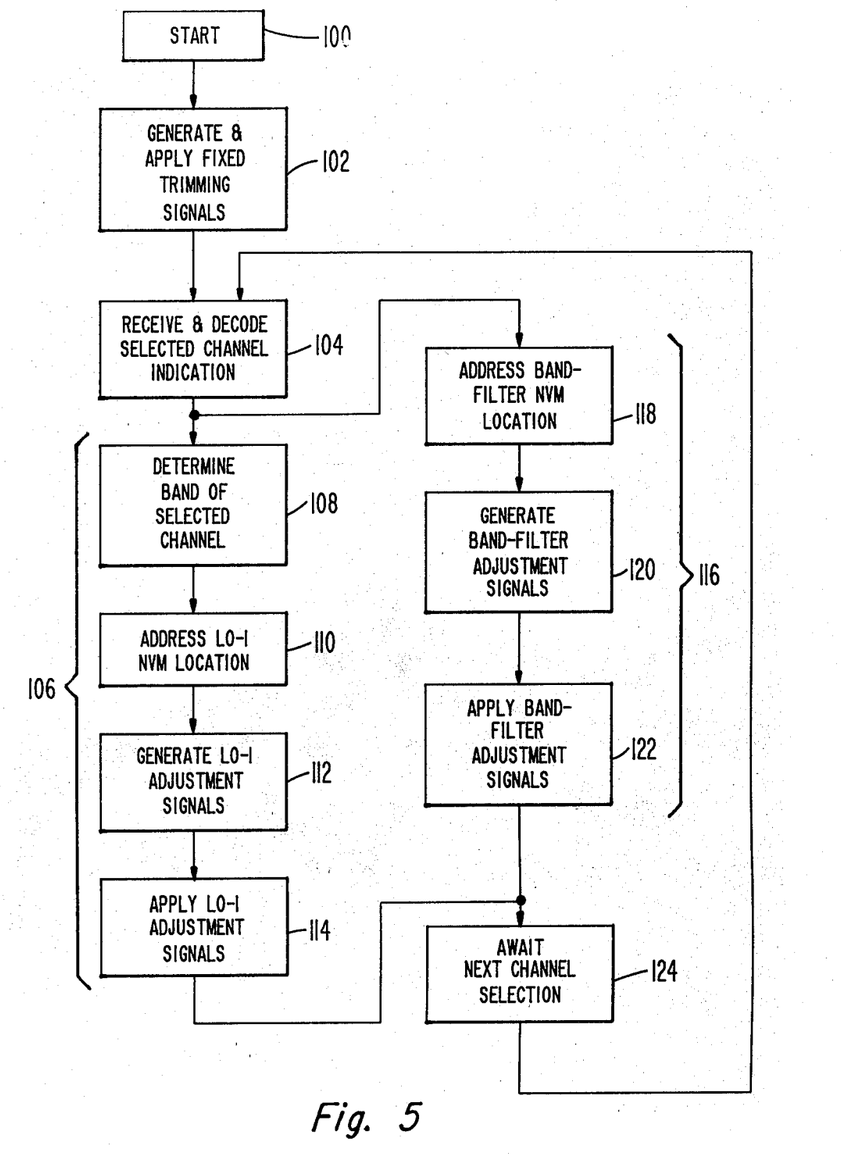
FIG. 5 is a flow diagram useful in understanding the embodiment shown in FIG. 1.

FIG. 5 shows a flow diagram descriptive of the operation of control logic DCL of PROM of FIG. 1. Start 100 is initiated by the turning on of the TV receiver in response to which DCL, via signal buses 28A and 28D, causes PROM to generate and apply fixed trimming signals 102 to TC-1, TC-2, DTF, TTF and LO-2, for example. In response to channel selection using keyboard KYBD, whether by user action or by a predetermined initial channel selection upon receiver turn-on, DCL receives and decodes the selected channel indication 104 received via signal bus 24. DCL then controls PROM to perform sequences 106 and 116 in parallel (at the same time). Sequence 106 is for the adjustment of local oscillator LO-1. Sequence 106 includes the steps of determining the band which contains the selected channel 108, addressing the NVM location 110 corresponding to LO-1, generating the adjustment signals 112 corresponding to LO-1 using a corresponding DAC, and applying those adjustment signals 114 to LO-1 using a corresponding ABA and signal bus 16. Sequence 116 is for adjusting band filters LV-DTF, HV-DTF and UHF-DTF. Sequence 116 comprises the steps of addressing the NVM location 118 of the band filter corresponding at least to the band of the selected channel, generating adjustment signals 120 therefor in a corresponding DAC, and applying those adjustment signals 122 to the band filter using a corresponding ABA and signal bus 14. At this point in the flow, all elements in the tuning system of FIG. 1 are receiving respective trimming adjustment signals so that the tuning system selects the selected channel for signal processing device SP to obtain picture display on kinescope KS and sound reproduction on loudspeaker LS. DCL thereafter awaits the next channel selection 124 and, when such selection is made, repeats receive and decode selected channel indication step 104 and sequences 106 and 116 for generating and applying adjustment signals. It is also satisfactory that the logic circuitry in DCL be arranged to perform sequences 106 and 116 serially in time instead of in parallel as shown in FIG. 5.

Modifications to the above-described embodiments are within the scope of the present invention which should be limited solely by the following claims. For example, signal buses 20, 22 and 24 can be arranged to have eight wires for transmitting 8-bit parallel digital words. Further, automatic fine tuning could be provided responsive to the frequency of the second IF signal by applying the control signal at the output of AFT directly to LO-1 or by applying that control signal to tuning control TC to affect tuning voltage VT.

Moreover, the electronic adjustment apparatus of the present invention provides tuning system alignment flexibility not heretofore possible. For example, circuits TC-1 and TC-2 may be adjusted to trap different frequencies depending upon the channel selected by increasing the memory locations allocated to the trap adjustment signal values and by programming control logic DCL to address appropriate memory locations responsive to the channel selected. For example, signals near the first IF frequency caused by intermodulation between, and by second harmonics of, VHF channel 12 picture and sound carriers (about 205 and 210 MHz, respectively) can be reduced by a channel 12 trap when channel 12 is not selected.

So that the number of memory locations can be selected to be a number intermediate the number of RF bands and the number of TV channels, the adjustment signal values stored memory locations of NVM can be modified, for example, to adjust the tuning of band filters LV-DTF, HV-DTF and UHF-DTF. One way to accomplish such modification is shown in FIG. 4 wherein the adjustment signal on lead 54 includes a portion applied through resistor R7 from lead 52 and developed responsive to coded signals stored in NVM and a portion applied through resistor R8 and developed responsive to a control signal received at terminal 56. It is further contemplated that the latter portion could be responsive to tuning voltage VT, for example, so that the tuning of the RF band filters is responsive at least in part to the channel selected. In particular, the digital words stored in the NVM can be programmed to values determined from the actual LO-1 tuning voltage vs. selected channel frequency characteristic so that the adjustment signals developed by PROM and applied to the band-filters cause the frequency to which the band-filters are tuned to track that of the selected channel responsive to the LO-1 tuning voltage. I.e., the LO-1 tuning voltage is modified and applied to the band-filters so that they will track the selected channel without the need for selecting varactor diodes or attempting to align those filters by mechanical means.

While the present invention has been described within a double-conversion tuning system in which received signals are twice heterodyned, i.e., by mixers MX and MA, it could be equally satisfactorily employed in single-conversion tuning systems such as those employed in most presently marketed commercial TV receivers. Moreover, the present invention can be satisfactorily employed in a frequency synthesis tuning system as described herein as well as in voltage synthesis, signal seeking or memory tuning systems.

What is claimed is:

1. A tuning system for a receiver for selecting one radio frequency (RF) signal of a plurality of receivable RF signals comprising:

RF means having first elements for providing a frequency selective characteristic with respect to at least a first frequency and having a second element for trimming said frequency selective characteristic with respect to substantially said first frequency in response to a trimming signal;

oscillator means for developing an oscillator signal, the frequency of which is controlled by a first control signal for selecting said one RF signal;

mixer means for heterodyning RF signals from said RF means and said oscillator signal to develop an intermediate frequency (IF) signal at a predetermined frequency;

first control means for developing said first control signal for selecting said one RF signal so that said one RF signal is shifted in frequency to said predetermined IF frequency by said mixer means; and second control means for developing said trimming signal having different predetermined magnitudes corresponding to groups of adjacent ones of said RF signals, and for applying said trimming signal to said second element to effect said trimming of said frequency selective characteristic.

2. The tuning system of claim 1 further comprising:

IF amplifier means for amplifying said IF signal developed by said mixer means and having at least one tunable circuit means for restricting the range of frequencies in which substantial amplification is provided, and means responsive to other trimming signals developed by said second control means for adjusting said tunable circuit means to a frequency related to said predetermined IF frequency.

3. The tuning system of claim 1 wherein said oscillator means includes:

at least one tunable circuit means for adjusting the relationship between the frequency of said oscillator signal and said first control signal to a predetermined relationship, and means responsive to other trimming signals developed by said second control means for adjusting said tunable circuit means to effect said predetermined relationship.

4. The tuning system of claim 1 further comprising:

second oscillator means for developing a second oscillator signal, the frequency of which is controlled by at least one tunable circuit means;

second mixer means for heterodyning said IF signal and said second oscillator signal to develop a second IF signal at a second predetermined frequency; and means responsive to another trimming signal developed by said second control means for adjusting said tunable circuit means so that said IF signal is shifted in frequency to said second predetermined frequency.

5. The tuning system of claim 1, 2, 3 or 4 wherein said second control means comprises:

memory means for storing coded signals representing values of said trimming signal, and means for developing said trimming signal from said stored coded signals.

6. The tuning system of claim 5 wherein said memory means includes a digital memory having a plurality of memory locations for storing said coded signals as binary words.

7. The tuning system of claim 5 wherein said means for developing includes digital-to-analog conversion means for converting said coded signals to said trimming signals.

8. The tuning system of claim 1 further comprising:

tunable circuit means included within said RF means for varying said frequency selective characteristic responsive to a second control signal; and means for developing said second control signal responsive at least in part to selection of said one RF signal, and for applying said second control signal to said tunable circuit means.

9. The tuning system of claim 8 wherein said means for developing said second control signal includes means for combining a trimming signal developed by said second control means and a signal responsive to said first control signal.

10. The tuning system of claim 8 wherein said means for developing said second control signal is included within said second control means and includes:

memory means for storing coded signals representing values of said second control signal corresponding to at least respective groups of said receivable RF signals, and address means for addressing said coded signal corresponding to the selected said one RF signal in response to the selection thereof; and wherein said means for developing develops said second control signal responsive to said addressed coded signal.

11. The tuning system of claim 10 wherein said memory means includes a digital memory having a plurality of memory locations for storing said coded signals as binary words.

12. The tuning system of claim 10 wherein said means for developing includes digital-to-analog conversion means for converting said addressed coded signal to said second control signal.

13. The tuning system of claim 1 wherein said first control means includes a frequency synthesizer.

14. A tuning system for a receiver for selecting one radio frequency (RF) signal of a plurality of receivable RF signals comprising:

RF means having an adjustable frequency selective characteristic for receiving said RF signals;

oscillator means for developing an oscillator signal, the frequency of which is controlled by a first control signal for selecting said one RF signal;

one of said RF means and said oscillator means including a trimming element responsive to a trimming signal;

mixer means for heterodyning RF signals from said RF means and said oscillator signal to develop an intermediate frequency (IF) signal at a predetermined frequency;

first control means for developing said first control signal for selecting said one RF signal so that said one RF signal is shifted in frequency to said predetermined IF frequency by said mixer means;

second control means for developing said trimming signal having different predetermined magnitudes corresponding to groups of adjacent ones of said RF signals including memory means for storing said trimming signal; and means for applying said trimming signal to said trimming element of said one of said RF means and said oscillator means.

15. The tuning system of claim 14 further comprising:

IF amplifier means for amplifying said IF signal developed by said mixer means and having at least one tunable circuit means for restricting the range of frequencies in which substantial amplification is provided, and means responsive to a second trimming signal stored in said memory means for trimming said tunable circuit means to a frequency related to said predetermined IF frequency.

16. The tuning system of claim 14 further comprising:

second oscillator means for developing a second oscillator signal, the frequency of which is controlled by at least one tunable circuit means;

second mixer means for heterodyning said IF signal and said second oscillator signal to develop a second IF signal at a second predetermined frequency; and means responsive to a second trimming signal stored in said memory means for trimming said tunable circuit means so that said IF signal is shifted in frequency to said second predetermined frequency.

17. The tuning system of claim 14 wherein said oscillator means includes:

at least one tunable circuit means for adjusting the relationship between the frequency of said oscillator signal and said first control voltage to a predetermined relationship, and means responsive to a second trimming signal stored in said memory means for trimming said tunable circuit means to effect said predetermined relationship.

18. The tuning system of claim 14, 15, 16 or 17 wherein said memory means includes:

digital memory means having a plurality of memory locations for storing said second trimming signals as binary words, and digital-to-analog conversion means for developing said second trimming signals from said binary words.

19. In a tuning system for a receiver for selecting one radio frequency (RF) signal of a plurality of receivable RF signals including filter means for receiving said RF signals, oscillator means for developing an oscillator signal, the frequency of which is controlled by a first control signal developed for selecting said one RF signal, and mixer means for heterodyning said RF signals from said filter means and said oscillator signal from said oscillator means to translate said one RF signal to a predetermined intermediate frequency;

means for adjusting the frequency selective characteristics of said filter means comprising:

tuning means included within said filter means for tuning its frequency selective characteristics responsive to second and third control signals;

memory means having a plurality of memory locations for storing coded signals representing values of said second control signal corresponding to at least respective groups of said receivable RF signals, and representing values of said third control signal unaffected by selection of said one RF signal;

address means for addressing said memory location corresponding to the selected said one RF signal in response to the selection thereof; and conversion means for developing said second control signal from the coded signal stored in said addressed memory location, for developing said third control signal from the coded signal stored in the memory location therefor, and for applying said second and third control signals to said tuning means to effect said tuning.

20. A tuning system for a receiver for selecting one radio frequency (RF) signal of a plurality of receivable RF signals comprising:

RF means having an adjustable frequency selective characteristic for receiving said RF signals;

oscillator means for developing an oscillator signal, the frequency of which is controlled by a first control signal for selecting said one RF signal;

mixer means for heterodyning RF signals from said RF means and said oscillator signal to develop an intermediate frequency (IF) signal at a predetermined frequency;

first control means for developing said first control signal for selecting said one RF signal so that said one RF signal is shifted in frequency to said predetermined IF frequency by said mixer means;

tunable circuit means included within said RF means for adjusting its frequency selective characteristic in response to an adjustment signal; and means for developing said adjustment signal including:

memory means for storing and developing a first component of said adjustment signal, said first component having a plurality of values corresponding to respective groups of adjacent ones of said RF signals, means for developing a second component of said adjustment signal in response to selection of said one RF signal, means for combining said first and second components to develop said adjustment signal and for applying said adjustment signal to said tunable circuit means for effecting said adjusting of said frequency selective characteristic.

21. The tuning system of claim 20 wherein said means for developing said second component of said adjustment signal develops said second component in response to said first control signal, and said means for combining includes a plurality of resistances for combining said first and second components of said adjustment signal in predetermined proportions.

22. A tuning system for a receiver for selecting one radio frequency (RF) signal of a plurality of receivable RF signals comprising:

oscillator means for developing an oscillator signal having a frequency controlled by a control signal;

mixer means to which said receivable RF signals and said oscillator signal are applied for heterodyning said receivable RF signals to develop an intermediate frequency (IF) signal;

first control means for developing said control signal so that said IF signal includes said one RF signal shifted to a predetermined frequency;

IF circuit means to which said IF signal is applied for passing said IF signal, said IF circuit means including tunable circuit means for limiting the bandwidth of said passed IF signal, and including a trimming element for trimming said bandwidth responsive to a trimming signal;

second control means for developing said trimming signal including:

memory means for storing and developing said trimming signal having a predetermined magnitude selected for trimming said bandwidth to a predetermined bandwidth which includes said predetermined frequency, and means for applying said trimming signal to said trimming element of said IF circuit means.

23. The tuning system of claim 22 wherein said memory means includes:

a digital memory for storing a digital representation of said predetermined magnitude of said trimming signal, and a digital-to-analog converter for developing said trimming signal in response to said digital representation.

24. The tuning system of claim 22 wherein:

said oscillator means includes a second trimming element responsive to a second trimming signal for trimming the relationship between values of said control signal and the frequency of said oscillator means;

said memory means stores and develops said second trimming signal having a predetermined magnitude selected for trimming said relationship to a predetermined relationship; and said means for applying applies said second trimming signal to said second trimming element of said oscillator means.

25. The tuning system of claim 22 further comprising:

second oscillator means for developing a second oscillator signal, including a second trimming element for trimming the frequency of said second oscillator signal in response to a second trimming signal;

second mixer means to which said passed IF signal and said second oscillator signal are applied for heterodyning said passed IF signal to develop a second IF signal; wherein said memory means stores and develops said second trimming signal having a predetermined magnitude selected for trimming the frequency of said second oscillator signal so that said second IF signal includes said passed IF signal shifted to a predetermined second IF frequency; and wherein said means for applying applies said second trimming signal to said second trimming element of said second oscillator means.

* * * * *